US011264479B2

(12) United States Patent
Grenouillet et al.

(10) Patent No.: US 11,264,479 B2
(45) Date of Patent: Mar. 1, 2022

(54) PROCESS FOR PRODUCING FET TRANSISTORS

(71) Applicant: COMMISSARIAT A L'ENERGIE ATOMIQUE ET AUX ENERGIES ALTERNATIVES, Paris (FR)

(72) Inventors: Laurent Grenouillet, Rives (FR); Maud Vinet, Rives (FR); Romain Wacquez, Marseilles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 106 days.

(21) Appl. No.: 14/426,007

(22) PCT Filed: Sep. 4, 2013

(86) PCT No.: PCT/EP2013/068300
§ 371 (c)(1),
(2) Date: Jun. 23, 2015

(87) PCT Pub. No.: WO2014/037411
PCT Pub. Date: Mar. 13, 2014

(65) Prior Publication Data
US 2015/0295066 A1    Oct. 15, 2015

(30) Foreign Application Priority Data
Sep. 5, 2012 (FR) ..................... 12 58264

(51) Int. Cl.
*H01L 29/66* (2006.01)
*H01L 29/786* (2006.01)
(Continued)

(52) U.S. Cl.
CPC .... *H01L 29/66477* (2013.01); *H01L 21/2652* (2013.01); *H01L 21/28008* (2013.01);
(Continued)

(58) Field of Classification Search
CPC .......... H01L 29/4236; H01L 29/66621; H01L 21/28008; H01L 21/3065; H01L 29/0653;
(Continued)

(56) References Cited

U.S. PATENT DOCUMENTS 5,451,804 A * 9/1995 Lur ................... H01L 21/76801
257/330
5,641,380 A * 6/1997 Yamazaki ......... H01L 21/32137
257/E21.312

(Continued)

FOREIGN PATENT DOCUMENTS

JP    62 89324    4/1987
JP    59 194438   11/1987

OTHER PUBLICATIONS

U.S. Appl. No. 14/426,007, filed Mar. 4, 2015, Grenouillet, et al.
(Continued)

*Primary Examiner* — Jay C Kim
(74) *Attorney, Agent, or Firm* — Oblon, McClelland, Maier & Neustadt, L.L.P.

(57) ABSTRACT

A method of production of a field-effect transistor from a stack of layers forming a semiconductor-on-insulator type substrate, the stack including a superficial layer of an initial thickness, made of a crystalline semiconductor material and covered with a protective layer, the method including: defining, by photolithography, a gate pattern in the protective layer; etching the gate pattern into the superficial layer to leave a thickness of the layer of semiconductor material in place, the thickness defining a height of a conduction channel of the field-effect transistor; forming a gate in the gate pattern; forming, in the superficial layer and on either side of the gate, source and drain zones, while preserving, in the zones, the initial thickness of the superficial layer.

21 Claims, 11 Drawing Sheets

(51) Int. Cl.

| | |
|---|---|
| *H01L 29/423* | (2006.01) |
| *H01L 29/10* | (2006.01) |
| *H01L 21/265* | (2006.01) |
| *H01L 21/28* | (2006.01) |
| *H01L 21/3065* | (2006.01) |
| *H01L 29/06* | (2006.01) |
| *H01L 29/78* | (2006.01) |

(52) U.S. Cl.
CPC ...... *H01L 21/3065* (2013.01); *H01L 29/0653* (2013.01); *H01L 29/1083* (2013.01); *H01L 29/4236* (2013.01); *H01L 29/42384* (2013.01); *H01L 29/66621* (2013.01); *H01L 29/66651* (2013.01); *H01L 29/66772* (2013.01); *H01L 29/7838* (2013.01); *H01L 29/7841* (2013.01); *H01L 29/78651* (2013.01)

(58) Field of Classification Search
CPC ........... H01L 29/66477; H01L 29/7838; H01L 29/7841
See application file for complete search history.

(56) References Cited

U.S. PATENT DOCUMENTS

| | | | |
|---|---|---|---|
| 5,736,435 A | 4/1998 | Venkatesan et al. | |
| 5,801,075 A * | 9/1998 | Gardner | H01L 29/41775 257/E21.429 |
| 5,817,558 A * | 10/1998 | Wu | H01L 21/28114 438/291 |
| 5,869,359 A * | 2/1999 | Prabhakar | H01L 29/41733 257/E21.415 |
| 6,033,963 A * | 3/2000 | Huang | H01L 21/76838 257/368 |
| 6,117,712 A * | 9/2000 | Wu | H01L 29/66613 257/E21.415 |
| 6,248,675 B1 * | 6/2001 | Xiang | H01L 21/28061 257/E21.133 |
| 6,278,164 B1 * | 8/2001 | Hieda | H01L 29/4983 257/295 |
| 6,278,165 B1 * | 8/2001 | Oowaki | H01L 21/28185 257/288 |
| 6,303,448 B1 * | 10/2001 | Chang | H01L 29/66621 257/E21.429 |
| 6,310,367 B1 * | 10/2001 | Yagishita | H01L 21/26506 257/19 |
| 6,313,008 B1 | 11/2001 | Leung et al. | |
| 6,358,800 B1 * | 3/2002 | Tseng | H01L 21/3086 257/E21.235 |
| 6,407,435 B1 * | 6/2002 | Ma | H01L 21/28185 257/406 |
| 6,429,055 B2 * | 8/2002 | Oh | H01L 29/66772 257/E21.415 |
| 6,465,842 B2 * | 10/2002 | Nishinohara | H01L 29/66545 257/330 |
| 6,492,696 B2 * | 12/2002 | Morimoto | H01L 21/76221 257/384 |
| 6,515,338 B1 * | 2/2003 | Inumiya | H01L 21/28114 257/368 |
| 6,541,829 B2 * | 4/2003 | Nishinohara | H01L 21/823807 257/345 |
| 6,573,134 B2 * | 6/2003 | Ma | H01L 21/823842 257/E21.637 |
| 6,642,130 B2 * | 11/2003 | Park | H01L 29/665 257/E21.429 |
| 6,716,046 B2 * | 4/2004 | Mistry | H01L 29/42376 257/E21.429 |
| 6,787,424 B1 * | 9/2004 | Yu | H01L 29/66772 257/431 |
| 6,815,285 B2 * | 11/2004 | Choi | H01L 21/265 257/E21.204 |
| 6,930,030 B2 * | 8/2005 | Rausch | H01L 21/3065 257/E21.205 |
| 6,943,087 B1 * | 9/2005 | Xiang | H01L 21/823807 438/149 |
| 7,033,869 B1 * | 4/2006 | Xiang | H01L 29/4908 257/347 |
| 7,102,203 B2 * | 9/2006 | Fujiwara | H01L 21/28194 257/407 |
| 7,192,837 B2 * | 3/2007 | Koh | H01L 29/66621 257/E21.429 |
| 7,217,602 B2 * | 5/2007 | Koh | H01L 29/458 257/E21.415 |
| 7,238,573 B2 * | 7/2007 | Park | H01L 29/66621 257/E21.429 |
| 7,390,709 B2 * | 6/2008 | Doczy | H01L 21/823842 257/E21.637 |
| 7,429,769 B2 * | 9/2008 | Diaz | H01L 29/66545 257/330 |
| 7,435,636 B1 * | 10/2008 | Hanafi | H01L 29/105 257/E21.441 |
| 7,459,752 B2 * | 12/2008 | Doris | H01L 29/66545 257/327 |
| 7,531,404 B2 * | 5/2009 | Pae | H01L 21/28185 438/211 |
| 7,550,359 B1 | 6/2009 | Cheng et al. | |
| 7,804,130 B1 * | 9/2010 | Fung | H01L 27/11 257/330 |
| 7,833,855 B2 * | 11/2010 | Kang | C23C 16/34 257/E21.637 |
| 7,858,481 B2 * | 12/2010 | Brask | H01L 29/42376 257/224 |
| 7,923,333 B2 * | 4/2011 | Lee | H01L 29/66621 257/330 |
| 7,964,487 B2 * | 6/2011 | Cheng | H01L 21/823807 257/E21.444 |
| 8,048,810 B2 * | 11/2011 | Tsai | H01L 21/28 257/E21.218 |
| 8,101,485 B2 * | 1/2012 | Bohr | H01L 21/28088 257/E21.632 |
| 8,143,668 B2 * | 3/2012 | Morita | H01L 21/823814 257/330 |
| 8,193,582 B2 * | 6/2012 | Matsubara | H01L 21/823456 257/334 |
| 8,298,885 B2 * | 10/2012 | Wei | H01L 21/823842 438/190 |
| 8,330,227 B2 * | 12/2012 | Hung | H01L 27/11 257/310 |
| 8,334,197 B2 * | 12/2012 | Lee | H01L 21/28185 438/591 |
| 8,338,887 B2 * | 12/2012 | Lindsay | H01L 21/26586 257/330 |
| 8,546,212 B2 * | 10/2013 | Su | H01L 21/823807 257/E21.202 |
| 8,623,739 B2 * | 1/2014 | Lee | G03F 7/40 438/400 |
| 8,629,014 B2 * | 1/2014 | Kwon | H01L 27/0922 257/407 |
| 8,709,897 B2 * | 4/2014 | Sung | H01L 21/26586 257/192 |
| 8,748,251 B2 * | 6/2014 | Na | H01L 21/823842 438/230 |
| 8,772,146 B2 * | 7/2014 | Kim | H01L 21/28008 257/686 |
| 8,786,027 B2 * | 7/2014 | Griebenow | H01L 29/7827 257/388 |
| 8,835,294 B2 * | 9/2014 | Chew | H01L 21/02697 257/330 |
| 8,836,049 B2 * | 9/2014 | Tsai | H01L 21/28088 257/412 |
| 8,883,651 B2 * | 11/2014 | Kim | H01L 21/26506 257/E21.09 |
| 8,900,954 B2 * | 12/2014 | Adkisson | H01L 21/28026 257/E21.409 |
| 8,937,349 B2 * | 1/2015 | Amari | H01L 29/4236 257/330 |
| 9,006,094 B2 * | 4/2015 | Jagannathan | H01L 21/28211 257/410 |
| 9,337,110 B2 * | 5/2016 | Lee | H01L 29/4966 |

(56) References Cited

U.S. PATENT DOCUMENTS

| | | | |
|---|---|---|---|
| 9,450,078 B1* | 9/2016 | Tang | H01L 29/66795 |
| 9,548,360 B2* | 1/2017 | Amari | H01L 29/4236 |
| 9,825,135 B2* | 11/2017 | Zhu | H01L 21/76897 |
| 2004/0169221 A1* | 9/2004 | Ko | H01L 29/66545 |
| | | | 257/330 |
| 2004/0248348 A1 | 12/2004 | Rausch et al. | |
| 2005/0085022 A1 | 4/2005 | Chidambarrao et al. | |
| 2005/0093075 A1* | 5/2005 | Bentum | H01L 29/66545 |
| | | | 257/368 |
| 2005/0139930 A1 | 6/2005 | Chidambarrao et al. | |
| 2006/0081942 A1* | 4/2006 | Saito | H01L 21/823807 |
| | | | 257/388 |
| 2007/0057326 A1 | 3/2007 | Morikado | |
| 2007/0190787 A1 | 8/2007 | Loubet et al. | |
| 2007/0254441 A1 | 11/2007 | Wei et al. | |
| 2008/0105920 A1* | 5/2008 | Hirano | H01L 21/823842 |
| | | | 257/327 |
| 2009/0280627 A1 | 11/2009 | Pal et al. | |
| 2010/0181619 A1 | 7/2010 | Wei et al. | |
| 2011/0097824 A1 | 4/2011 | Berliner et al. | |
| 2011/0147831 A1* | 6/2011 | Steigerwald | H01L 21/823431 |
| | | | 257/330 |
| 2011/0147841 A1 | 6/2011 | Morikado | |
| 2011/0210389 A1* | 9/2011 | Griebenow | H01L 29/1037 |
| | | | 257/330 |
| 2012/0056258 A1 | 3/2012 | Chen | |
| 2012/0061774 A1* | 3/2012 | Morita | H01L 21/823814 |
| | | | 257/411 |
| 2012/0125538 A1 | 5/2012 | Berliner et al. | |
| 2013/0082332 A1* | 4/2013 | Liu | H01L 29/4966 |
| | | | 257/369 |
| 2015/0340464 A1* | 11/2015 | Tang | H01L 29/78 |
| | | | 257/330 |

OTHER PUBLICATIONS

U.S. Appl. No. 14/426,029, filed Mar. 4, 2015, Grenouillet, et al.
Loubet, N. et al., "Silicon Etching Study in a RT-CVD Reactor with the HCl/H2 Gas Mixture", Mater. Res.Soc. Symp. Proc., vol. 910, Total 6 Pages, (Apr. 18, 2006), XP055062215.
Lee, K. et al., "Fabrication of Suspended Silicon Nanowire Arrays", SMALL, vol. 4, No. 5, pp. 642-648, (May 2008), XP002695862.
Bauer, M. et al., "Low temperature catalyst enhanced etch process with high etch rate selectivity for amorphous silicon based alloys over single-crystalline silicon based alloys", Thin Solid Films, vol. 520, No. 8, pp. 3139-3143, (Feb. 1, 2012), XP002695863.
International Search Report dated Nov. 15, 2013 in PCT/EP13/068300 Filed Sep. 4, 2013.
International Search Report dated Oct. 23, 2013 in PCT/EP13/068299 Filed Sep. 4, 2013.

* cited by examiner

PRIOR ART

PRIOR ART

PRIOR ART

PROCESS FOR PRODUCING FET TRANSISTORS

TECHNICAL FIELD OF THE INVENTION

The present invention generally relates to field effect transistors (FETs) used by the microelectronics industry and more particularly those having nanometric dimensions with very thin channels produced from substrates of the silicon-on-insulator (SOI) type.

STATE OF THE ART

The relentless race for a reduction in the dimensions that characterizes the whole microelectronics industry could be achieved only with the constant improvement of photolithographic techniques throughout decades of development since the first integrated circuits were produced industrially in the sixties. They make it possible to define ever smaller patterns until nanoscale dimensions are reached as required by the technological families or "nodes" currently under development, more particularly the so-called 28 nanometer (nm) and 22 nm ones. The improved photolithography techniques and the use of an always more elaborate structure of the transistors have enabled an ever more advanced integration of integrated circuits. The doubling of density every two years, as per the so-called MOORE law can still be observed despite the fact that the dimensions reached are now close to atomic dimensions for the materials constituting the active components of an integrated circuit.

The standard structure of a transistor 100 is that currently shown in FIG. 1a. This is a field effect transistor or FET, the source and drain electrodes 110 of which are self aligned with that of the gate 120 which controls the conduction of the transistor. It should be noted here that the source and drain zones are generally perfectly symmetrical and can interchangeably be used either as source or drain for the electrical operation of the transistor. They are generally designated by the acronym SD in the following.

This structure is typically obtained from a stack of layers, also called a developed substrate, of the "semiconductor on insulator" i.e. SOI 130 type. As the SOI substrate consists of a thin superficial layer 132 made of a single-crystal semiconductor material, most commonly silicon, on a buried oxide layer 134 also called BOX. This assembly is mechanically supported by a thick substrate, also called a carrier substrate 136, which constitutes the body of the SOI substrate, usually made of solid silicon. The transistors are laterally insulated from one another by trenches 140 filled with oxide which go through the superficial layer 132 to form, with the BOX layer, an insulation box 145. This technique is well known to the persons skilled in the art, and is called STI for "shallow trench insulation".

The above structure makes it possible to obtain transistors the thickness 133 of the channel of which is low and well controlled, typically of the order of 5 to 8 nm. It thus makes it possible to produce transistors of the FDSOI type, the acronym for "fully depleted silicon on insulator", which are suitable for current technological nodes of 28 nm and 22 nm. Obtaining a thin conduction channel between source and drain ensures a better electrostatic control of the gate 120 on the latter and minimizes the short channel effects thus reducing leakage currents between source and drain The structure 100 is also characterized by the presence of raised source drain or RSD. The RSDs 112 are formed by local epitaxy of these zones from the superficial layer 132 of the SOI in a range thickness 113 typically from 10 to 30 nm.

This aims at thickening the thin superficial layer from the SOI substrate in order to reduce the access resistances to the source and drain electrodes and enable them siliconizing (not shown) to obtain a good electrical contact resistance on such electrodes. Forming the RSDs involves the prior execution of spacers 150 on the sidewalls of the gate. The spacers, typically made of silicon nitride (SiN), make it possible to protect the gate zones during the epitaxial growth of the RSDs during the siliconizing thereof so as to avoid short-circuits between the source-drain and the gate.

FIG. 1 however shows an idealized view of the obtained transistors. In fact, these are more in line with what is shown in FIG. 1b which highlights defects generated by the current standard production method. In particular, the etching of the gate 120 and the forming of the spacers 150 result in the superficial layer 132 of the SOI substrate being partially etched during these operations. The initial thin layer 133 then remains under the gate itself only. The selective etching of the gate and the spacers consumes a portion of the silicon of the layer 132 and leaves in place at best a reduced thickness 135 only. The fluctuations inherent in any technological method and the low initial thickness of the layer 132 possibly result in no silicon locally remaining at all in some zones 137. The forming of the RSDs will of course be seriously affected since no epitaxial growth can then occur from such zones.

In addition a significant fluctuation in the thickness 113 of the obtained RSD zones 112 can be noted. With the best production tools currently available, such variation is at best of the order of 5 to 10% of the thickness of the RSDs, i.e. of a few nanometers, between the edge and the center of the plate, i.e. between the edge and the center of a SOI wafer from which the circuits are produced. Such fluctuation may depend on the fill factor. Such factor is the ratio of surfaces subjected to epitaxy to those that are not. It is thus a measure of the density of the patterns transferred by epitaxy on a plate. Important local thickness fluctuations, i.e. variations in thickness on the same drain or source zone can be observed, because the deposited thickness also strongly depends on the fill factor which itself depends on the patterns defined by the photolithography mask used.

These defects seriously affect the performances of the transistors, thus significantly reducing the yield of the circuits produced per plate. Physical dispersions cause a dispersion of the electrical parameters of the transistors thus reducing the number of those that meet the specifications necessary to ensure the proper functionality of the circuits present on a plate.

It is therefore an object of the invention to describe a method for producing FETs transistors which at least partly overcome the defects described above. In particular, the present invention aims at reducing the local dispersion of the semiconductor thickness or reducing the dispersion of the semiconductor thickness across the plate and preferably both at the channel and source and drain zones levels.

Other objects, characteristics and advantages of the present invention will become apparent upon examining the following description and the appended drawings. It is understood that other advantages may be included.

SUMMARY OF THE INVENTION

One embodiment of the present invention relates to a method for producing a field effect transistor from a stack of layers forming a substrate of the semiconductor-on-insulator type, with the stack comprising a superficial layer of a given initial thickness, made of a crystalline semiconductor material and covered with a protective layer such as a continuous layer of oxide or nitride preferably formed from the superficial layer. The method includes the following steps:

defining, by photolithography, a gate pattern in the protective layer;

etching the gate pattern into the superficial layer so as to leave a controlled thickness of the layer of semiconductor material in place, with said thickness defining the height of a conduction channel of the field-effect transistor; This etching may comprise one or more successive steps of etching to obtain the desired depth;

forming a gate in the gate pattern;

forming, in the superficial layer and on either side of the gate, source and drain (SD) zones, while preserving, in these zones, the initial thickness of the superficial layer of the original substrate.

Thus, the thickness of the channel can be controlled by the etching, while preserving the initial thickness of the superficial layer to form the source and drain zones. The invention thus makes it possible to eliminate the risk of uncontrolled over-etching of the sacrificial layer at the source and drain zones. The uniformity of the superficial layer upon forming the source and drain zones is thus identical to the uniformity of the superficial layer of the SOI substrate at the beginning of the process. The uniformity of the original layer of the developed substrate is not affected by successive etching as in the standard method. This uniformity can thus be better controlled. Furthermore, thanks to the invention, all the transistors on the plate have substantially the same uniformity and the same thickness of superficial layer, thereby avoiding significant variations in the behaviour between the transistors of the same plate.

In another embodiment, the invention relates to a field effect transistor comprising a stack of layers of the semiconductor-on-insulator type comprising a superficial layer made of a crystalline semiconductor material supported by a buried protective layer, characterized in that the surface layer has a plane upper face with a hollow pattern, with the pattern having a flat bottom substantially parallel to said upper surface and slanted walls extending from said upper face to the flat bottom, in that a portion of the superficial layer located under the pattern forms the transistor channel, in that the transistor gate is formed at least partly in the pattern, in that the spacers of the gate are preferably formed integrally in the pattern and in contact with the slanted walls.

It is specified that the method of the invention is not limited to producing the transistor and that other structures of transistors can be obtained by implementing the method according to the invention.

Optionally, the transistor according to this embodiment, has at least one of the following characteristics:

the superficial layer only has two levels of thickness for each transistor, with a first thickness forming the channel and being defined by the pattern and a second thickness on either side of the pattern and forming the source and drain zones.

the slanted walls have the same orientation as the crystallographic plane of the semiconductor material of the superficial layer.

a layer of silicon oxide or silicon nitride, or more generally a layer having a low dielectric constant covers the superficial layer, including over the slanted walls and except for the flat bottom of the pattern. The K dielectric constant of this layer is lower than 10. It can be a dielectric layer. Advantageously, this layer with a low dielectric constant makes it possible to reduce the parasitic capacitance between the gate and source or drain.

In another embodiment, the object of the invention is a microelectronic device comprising a plurality of transistors of the fully depleted semiconductor on insulator (FDSOI) type obtained according to the method of the invention.

Another object of the present invention relates to a microelectronic device comprising a plurality of transistors according to the invention. Micro-electronic device means any type of device produced with micro-electronic means. Such devices more particularly concern, in addition to purely electronic purposes devices, micro-mechanical or electro-mechanical (MEMS, NEMS . . . ) and optical or opto-electronic devices (MEOMS . . . ) devices In another embodiment, the invention relates to a method for producing a field effect transistor from a superficial layer of a single-crystal semiconductor material belonging to a developed substrate of the semiconductor silicon on insulator (SOI) type, with said method comprising the forming, beforehand, of a continuous layer of oxide on the surface of the SOI substrate and the making of trenches (STI) intended to electrically insulate each one of the transistors in a casing, with said method being characterized in that, after completion of the casings: a gate pattern is defined in each one of the casings by photolithography in the continuous oxide layer; the gate pattern is etched in the semiconductor superficial layer so as to leave in place a layer of semiconductor material having a controlled thickness defining the height of a conduction channel of a field effect transistor.

BRIEF DESCRIPTION OF THE FIGURES

The goals and objectives as well as the characteristics and advantages of the invention will better emerge from the detailed description of an embodiment of the latter which is illustrated by the following appended drawings wherein.

Figure 1A:
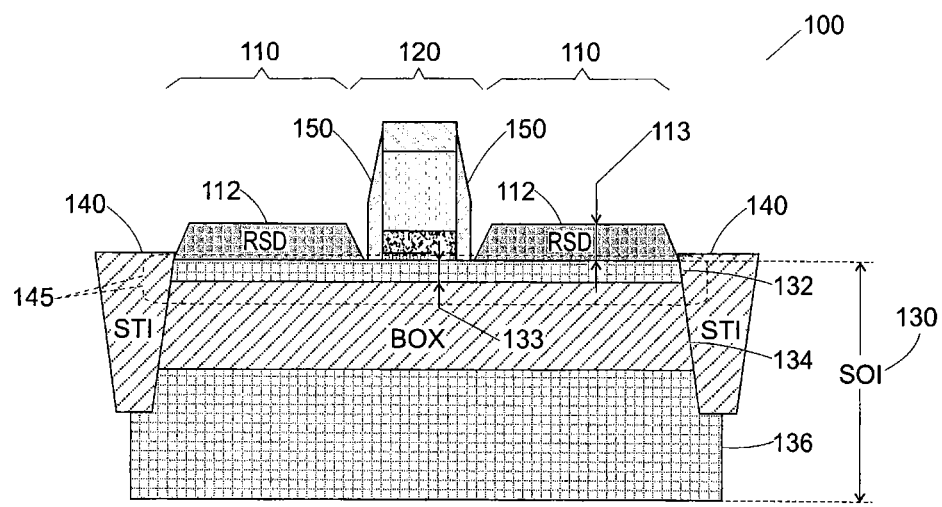
FIGS. 1a and 1b illustrate the current structure of a nano-sized FET transistor and the defects resulting from the standard production method of this type of transistors.
Figure 1B:
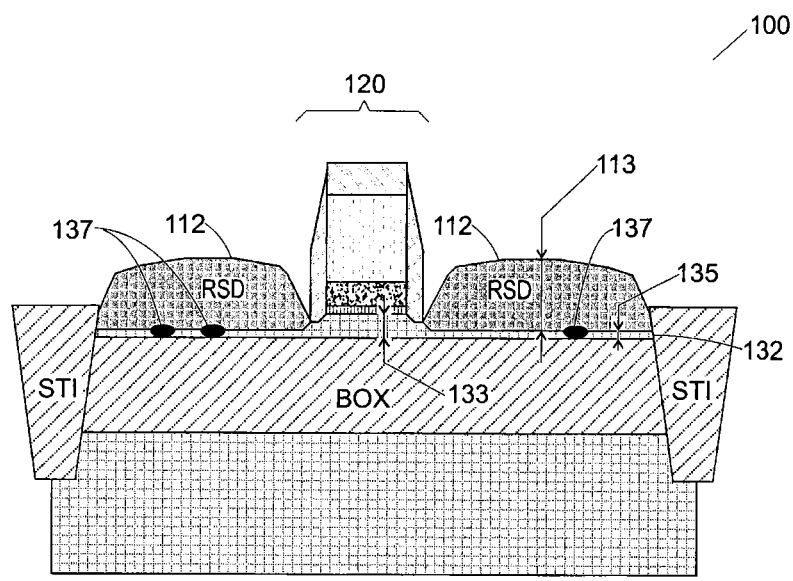

The drawings attached are given as examples and are not limiting to the invention. In addition, the drawings in the figures are schematic representations of the principle, and are not necessarily to scale with practical applications. In particular, the thickness of the substrates and that of the various layers constituting the devices described are not representative of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

Before proceeding with the detailed description of an embodiment of the invention, it is reminded that, according to one aspect, the invention relates to a method for producing a field effect transistor from a stack of layers forming a substrate of the semiconductor-on-insulator type, with the stack comprising a superficial layer having a given initial thickness, made of a crystalline semiconductor material and covered with a continuous layer of oxide. The method comprises the following steps: defining by photolithography a gate pattern in the continuous oxide layer; etching the gate pattern into the superficial layer so as to leave a controlled thickness of the layer of semiconductor material in place, with said thickness defining the height of a conduction channel of the field effect transistor; forming a gate in the gate pattern, forming source and drain zones (SD) in the superficial layer and on either side of the gate, while keeping the initial thickness of the superficial layer of the original substrate in these zones.

Optionally, the method according to the invention may comprise at least one of the following characteristics and optional steps:

The step of forming the trenches (STI) is preferably performed prior to defining the gate pattern.

Preferably, forming the gate comprises the following steps performed after forming the gate pattern to form a gate electrode: depositing, over the entire surface of the stack, a plurality of layers intended to form the electrode gate, a chemical mechanical polishing (CMP) of said plurality of layers made in order to leave said plurality of layers in the gate pattern only. Thus the chemical mechanical polishing removes the plurality of layers until the continuous oxide layer is exposed. As soon as the upper face of the continuous oxide layer is exposed, polishing is stopped. The plurality of layers then remains inside the recess formed by the gate pattern only. Preferably, the plurality of layers intended to form the gate electrode comprises an insulating layer intended to form a gate oxide, a layer intended to form a body of the gate electrode and a layer intended to form a conductive layer over the body of the gate electrode.

The etching of the gate pattern is preceded by an amorphization of the semiconductor material constituting the superficial layer of a controlled depth of said superficial layer. The amorphization depth preferably corresponds to the thickness of the superficial layer minus the thickness of the transistor channel.

Advantageously, the gate pattern is preferentially and preferably exclusively etched in the amorphized zone.

According to an advantageous embodiment, the amorphization comprises implanting species taken from argon (Ar), germanium (Ge). Preferably, amorphization is executed by means of an ion implanter. Amorphization preferably comprises a highly anisotropic ion bombardment, with the preferred direction of the bombardment being substantially perpendicular to the surface of the superficial layer. The etching is preferably executed in the gaseous phase in presence of hydrogen chloride (HCl).

According to another advantageous embodiment, the etching of the gate pattern is carried out according to the crystallographic planes of the semiconductor material constituting the superficial layer to leave a flat-bottomed cavity partly extending under a lower face of the continuous layer of oxide and on either side of the gate pattern. Preferably, the deposition of the plurality of layers intended to form the gate is preceded by the compliant deposition of a layer of a low-permittivity material, having a K dielectric constant lower than 10. Advantageously, the layer of said low-permittivity material is etched to leave in place spacers on either side of the grid pattern only. This result may, for example, be obtained by selectively and anisotropically etching, typically using a plasma etching, the layer of low-permittivity material that has been deposited.

Preferentially, the low-permittivity material is selected from: silicon nitride, silicon oxide, high-temperature (HTO) silicon oxide or tetraethoxysilane (TEOS).

Advantageously, the deposition of the plurality of layers comprises depositing a layer of oxide; with said layer comprising a high-permittivity insulating material having a dielectric constant greater than 8. A high permittivity insulating material such as hafnium oxide (Hf02) having a dielectric constant close to 25, aluminum oxide, nitrided hafnium silicate (HfSiON), Zinc oxide (Zr02) can advantageously be used for the dielectric layer.

Advantageously, the superficial layer has an initial thickness, i.e. upon completion of the forming of the substrate of the semiconductor on insulator type, ranging from 6 to 30 nm (nanometers) and preferably from 8 to 20 and preferably of about 12 nm.

Preferably, the etching of the gate pattern is performed so as to leave in place a thickness defining the transistor channel between 1 and 10 nm and preferably between 2 and 8 and preferably of about 6 nm.

Preferably, the superficial layer is made of silicon (Si), silicon germanium (SiGe) or germanium (Ge).

The protective layer is disposed in contact with the superficial layer. It makes it possible to form the gate pattern. It also makes it possible to adjust the height of the gate stack. The thickness of this protective layer is typically ranging from 10 to 100 nm and preferably from 12 nm to 30 nm.

The protective layer is thus advantageously formed from the superficial layer, e.g. by oxidation or nitriding. Thus, if the superficial layer is a silicon layer, the protective layer may be a silicon oxide or silicon nitride layer.

According to a first embodiment, the gate is formed before the source and drain zones. According to another embodiment, the gate is formed after the source and drain zones.

Preferably, the stack of layers comprises a carrier substrate over which a buried oxide layer is positioned, over which a layer of semiconductor material is positioned in turn, with the continuous oxide layer being formed on the surface of the layer using a semiconductor material.

More specifically and preferably, the buried oxide layer is directly in contact with the carrier substrate. Preferably, the superficial layer is directly in contact with the buried oxide layer. Preferably, the continuous oxide layer is directly in contact with the superficial layer.

Preferably, the semiconductor material of the superficial layer is a single-crystal one.

Preferably, the method according to the invention comprises a step of forming the continuous layer of oxide from the superficial layer of a semiconductor material of the semiconductor substrate on insulator type.

Preferably, the stack of layers comprises trenches (STI) intended to electrically insulate each one of the transistors in a casing.

Preferably, the method according to the invention comprises a step of forming trenches (STI) intended to electrically insulate each one of the transistors in a casing.

In one advantageous but non-limiting embodiment, the method comprises, between the step of etching the gate pattern into the superficial layer and prior to the step of forming the gate, a step of ion implantation. The implantation is carried out at least at right angles to the gate pattern and so as to implement a substrate underlying the insulating layer of the stack of the semiconductor on insulator type. Advantageously, a ground plane is thus formed. Preferably, the ion implantation further comprises implanting source and drain zones to provide a doping. The doping of the source and drain zones and the forming of the ground plane are performed simultaneously during the same implantation. A thick padoxide is preferably used to adjust the implantation depth of the ground plane and the source and drain zones.

FIGS. 2a-2f illustrate the main steps of the standard method for obtaining nano-sized FET transistors and the defects it causes.

Figure 2A:
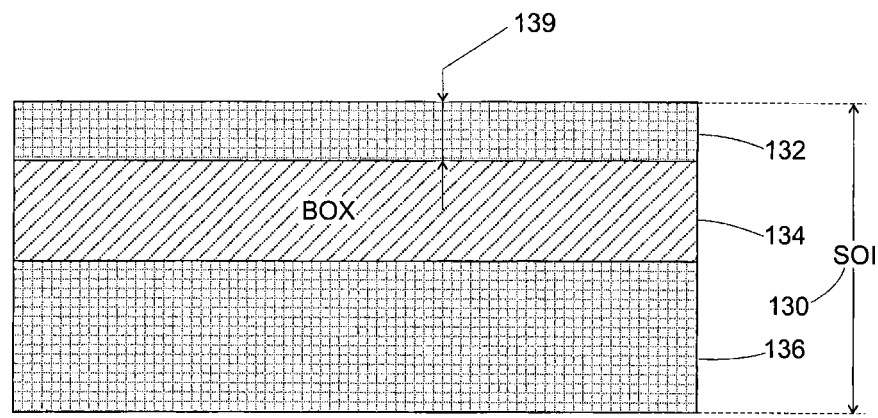
FIGS. 2a-2f illustrate, for comparison with the method of the invention, the steps of the standard method for producing nano-sized FET transistors and the defects it causes.

FIG. 2a shows the cross-sectional view of a SOI substrate 130 from which the integrated circuits made of the nano-sized transistors are made. They include the layers already described and more particularly the buried oxide layer 134 and the superficial layer 132, usually made of single-crystal silicon from which the active components of the integrated circuit will be made. In a standard SOI substrate 139 the thickness of this layer is typically about 12 nm, initially. The so-called BOX, for buried oxide, layer typically has a thickness of about 25 nm.

Figure 2B:
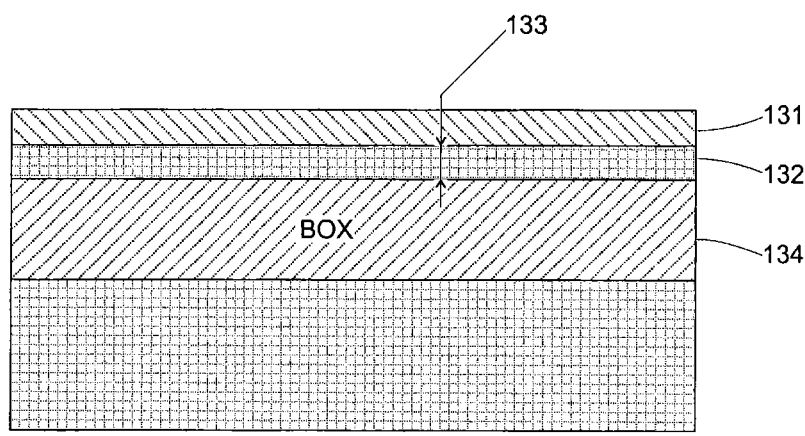

FIG. 2b illustrates the first step which consists in adjusting the thickness of the superficial layer 132 of the SOI substrate from which the transistors will be produced. The final thickness of such layer will give the thickness of the conduction channel of the transistors of which we have already seen that it should be preferably in a range of 5 to 8 nm so as to obtain the desired electrical performance. As the initial thickness 139 is typically 12 nm this layer 131 is thinned by oxidation and then chemical removal of the oxide to obtain the desired channel thickness 133. For the following operations, a continuous oxide layer 131 covering the surface of the SOI substrate is left in place.

Figure 2C:
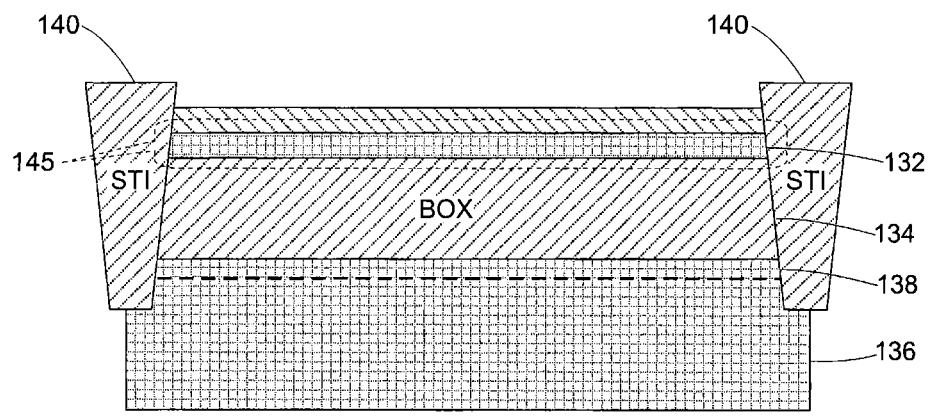

FIG. 2c shows the result of the standard step of forming the lateral insulation trenches (STI) 140 which make it possible to create an insulation casing 145 for each one of the transistors that will be achieved, with the buried oxide layer (BOX) 134.

It should be noted here that, when the buried oxide layer (BOX) is sufficiently thin, typically less than or equal to 25 nm, a "ground plane" 138 (GP) may optionally be formed in the substrate 136, under the BOX layer 134 within the scope of the standard method. This ground plane helps control the threshold voltage of the transistor contained in the insulation box 145. It is obtained at this stage by ion implantation of dopant species through the BOX layer when it is thin enough. This technique is known to the person skilled in the art under the acronym UTBB, for "ultra thin body and BOX" which characterizes the type of SOI substrate used for transistors of the FDSOI type which the invention more particularly refers to as discussed in the chapter relating to the state of the art.

Figure 2D:
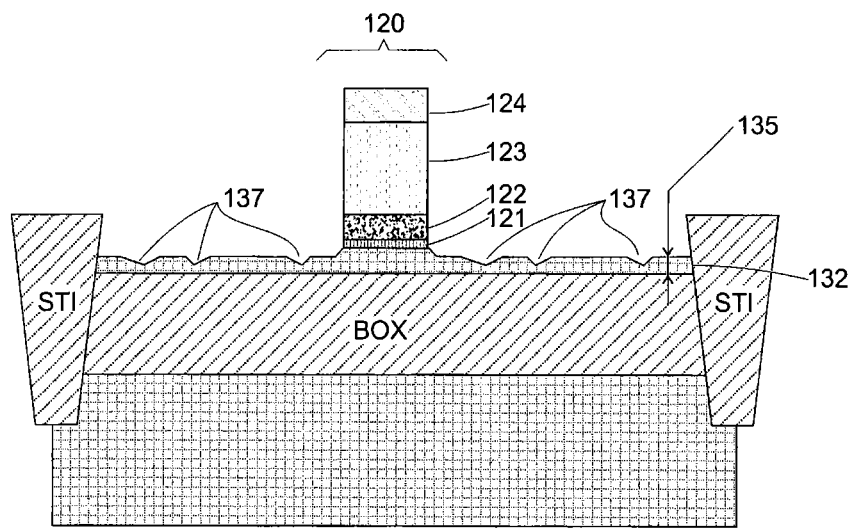

FIG. 2d shows the result of the method steps during which the stack of gate layers 120 is formed. In this example, and in a standard way, the gate electrode, at this stage of the method, consists of four layers: first the thin insulating layer of gate oxide 121 through which an electric field will be able to develop to create the underlying conduction channel between source and drain which are not yet formed at this stage. The layer 123, which constitutes the body of the gate electrode 120 is generally made of conductive polycrystalline silicon. In the most recent FET transistors, a so-called "high-k/metal gate" technology is implemented, i.e. the dielectric layer 121 is made of a high permittivity (high-k) insulating material covered by a metal gate represented by the layer 122. At this stage, the stack of layers of the gate 124 also includes a protective hard mask that will be removed later to enable the recovery of contact on this electrode.

FIG. 2d also shows the surface state of the superficial layer 132 which has significant unevenness 137 after etching the stack of layers forming the gate 120. Silicon is also used which further reduces the average thickness 135 of the superficial layer 132 in the zones not protected by the gate.

Figure 2E:
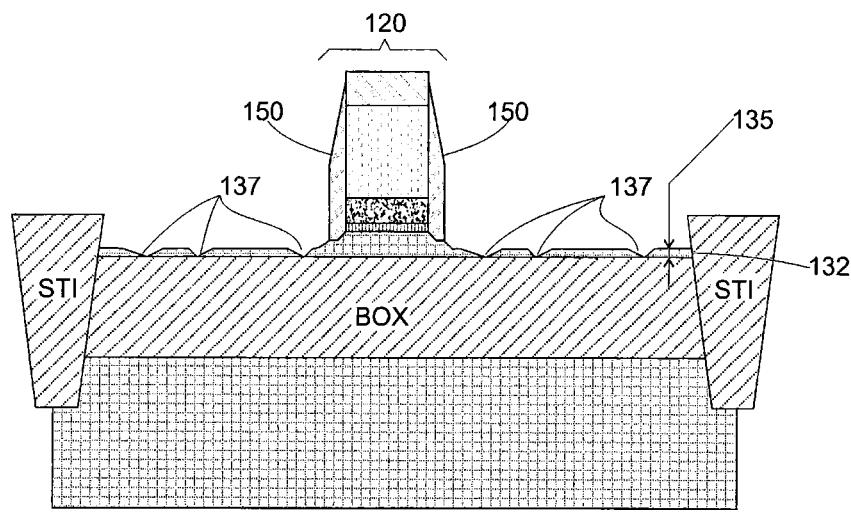

FIG. 2e illustrates the aggravation of the above defects after forming the spacers 150 that will protect the side walls of the gate. An additional consumption of the silicon of the superficial layer 132 should also be noted. A reduced thickness 135 of silicon only remains after etching the spacers. The unevenness and non-uniformity of the thickness of the layer 132 result in a total absence of silicon possibly being observed in some zones 137.

Figure 2F:
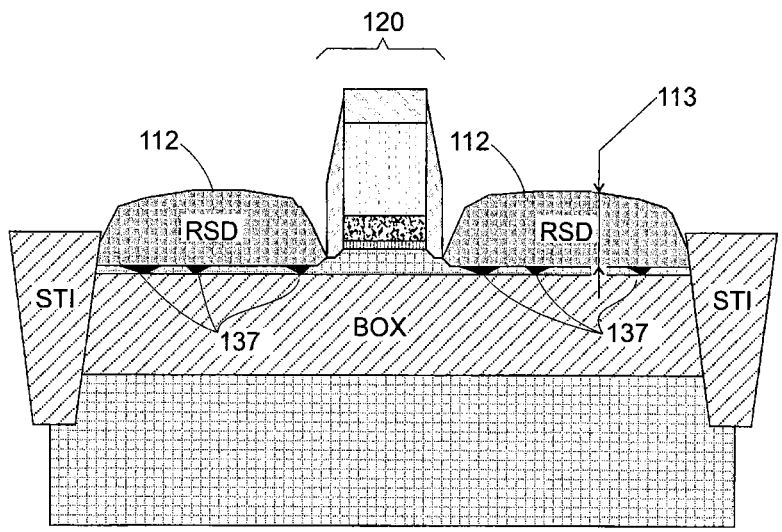

FIG. 2f shows the result of forming raised source and drain (RSD) 112. As already discussed, the epitaxial growth is strongly disturbed in the absence of silicon in the zones 137 and significant thickness dispersions 113 of the RSD can be observed on each of the patterns 112 and between the patterns on the whole SOI wafer.

The standard method briefly described in the preceding figures therefore has serious drawbacks due to the reduction in the dimensions required to produce the current technological nodes 28 and 22 nm and in particular those related to the reduction in the thickness of the channel more particularly described above. As regards the future technological nodes, and more particularly the 14 nm one, the thickness of the channel will again be reduced to a range of 5 to 6 nm, or ideally to a thickness range from 3 to 4 nm, in order to ensure a good electrostatic control of the gate on the canal. When using conventional approaches known to the persons skilled in the art, i.e. the one wherein the gate is produced first, usually called "gate first" as described in FIGS. 2a to 2f, or the one wherein the gate is produced last, called "gate last", when the gate (the real gate in the "gate first" method or the sacrificial gate in the "gate last" method), it can be seen that, even though the most efficient etching methods are implemented, at least 1 to 2 nm of silicon of the superficial layer 132 of the SOI substrate are still consumed. Only a few nanometers, on average, of silicon then remain in the zones where the growth of the source and drain must be performed. This is a serious drawback because a seed of single-crystal silicon sufficient to ensure a good single-crystal epitaxial growth of the RSDs is required. In particular, given the "roughness mean square" or rms which is obtained in a standard way on the surface of an SOI substrate and which is about 0.2 nm, a maximum difference is obtained between peaks and troughs that reaches 1.2 nm. With an average residual thickness of the superficial layer of the SOI substrate which is then in a range of 1 to 2 nm, this implies that no silicon from the layer 132 locally remains. In addition, when the thickness of the superficial layer of the SOI substrate is of the order of a few nanometers, problems of agglomeration or "crumpling" of the thin silicon layer arise during the step of annealing in presence of hydrogen which is performed before the epitaxy to prepare the surface.

Another serious drawback is the non-uniformity of the epitaxial thickness of the RSDs. Dispersions of the order of 5 to 10% can be observed on the SOI wafers, which commonly have a diameter of 300 millimeters currently. This of course affects the electrical properties of the transistors which causes, for example, fluctuations in the parasitic capacitances since the thickness of the RSDs opposite the gate varies. In addition a "loading effect" or filling factor can be noted, which causes that the epitaxial thickness may depend on the local pattern density and size. The thickness is for example typically 25 nm in the zones where static memory (SRAM) is implemented and wherein the spacing between patterns is around or less than 50 nm and 50 nm in less dense zones i.e. where the spacing between patterns may reach a few microns.

A general technical problems in the standard methods is that, with decreasing dimensions, which is already significant for the existing nodes but will be even more important for the nodes to come, the slightest variation in thickness, even though it may be of the order of 1 to 2 nm, has a significant impact on the morphological properties of transistors. Such variation especially affects the silicon of the channel and the RSDs (missing silicon). This leads to fluctuations in the electrical properties of the transistors which results in a loss of efficiency of the plates of the produced circuits due to the fact that a larger proportion thereof may then be out of specification.

The current standard methods of production are reaching their limits. The method described hereunder with reference to FIGS. 3a to 3f is an advantageous embodiment of the invention which provides a solution to reduce the thickness dispersion which affects the channel and RSDs in the techniques of the FDSOI types used for the current technological nodes. In this embodiment, the superficial layer 132 is not thinned contrary to the standard method described above, wherein the operation is performed on the entire surface of the SOI substrate so as to adjust the thickness channel as shown in FIG. 2b.

As will be seen, the variations in thickness of this layer then remain those of the original substrate, including at the sources and drains. A significant difference with the method of the invention relates to a new method for defining the channel and the gate based on an etching of a portion of the superficial layer to form therein a pattern within which the gate is formed. In the non restrictive embodiment illustrated in FIGS. 3a to 3f, the definition of the channel and of the gate is based on an amorphization of the silicon of the gate zones by ion implantation followed by an etching in the gaseous phase based on hydrogen chloride or HCl to adjust the thickness of the channel.

Figure 3A:
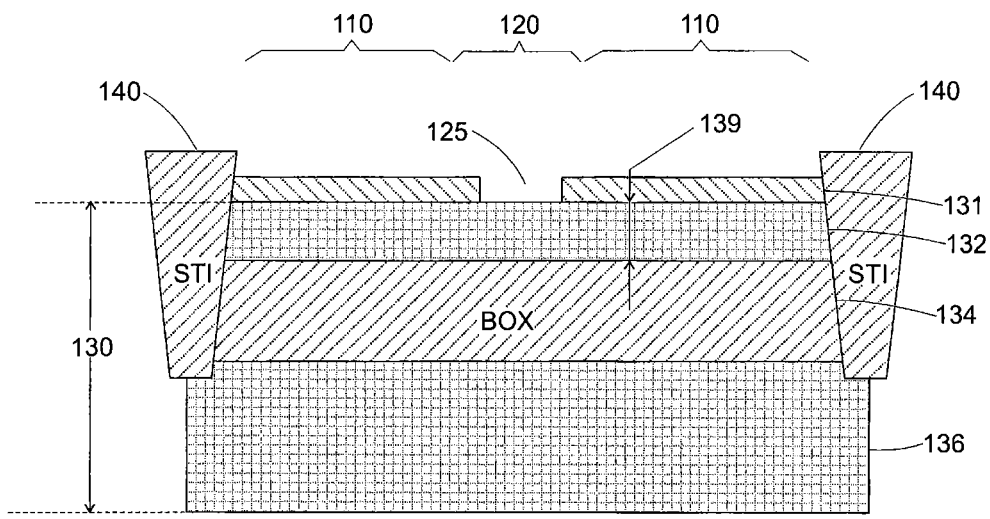
FIGS. 3a-3g illustrate the method for obtaining nano-sized transistors according to the invention which makes it possible to overcome the above defects.

FIG. 3a illustrates the first step of the method specific to the method of the invention. The preceding steps remain identical to those of the standard method and more particularly those that enable the formation of the transistors insulation casings by creating insulation trenches 140 or TSI around each one of these.

As already noted above, the step of thinning of the superficial layer 132 is however not carried out on the SOI substrate which keeps its original thickness 139, which is typically 12 nm, and which may be advantageously selected in a range from 10 to 50 nm and preferably from 12 to 17 nm when implementing the method of the invention. The step of the standard method which corresponds to FIG. 2b is thus not executed. The thickness 139 of the superficial layer, taken along a direction substantially perpendicular to the plane wherein such layer extends is called the original thickness or the initial thickness, i.e. the thickness at the start of the method. Unlike the method of the prior art, the layer 131 created on the surface of the superficial layer 132 is kept during the forming of the gate. The thickness 139 of the superficial layer 132 is not changed further to the forming of the layer 131.

The thickness of the layer 131 determines the final thickness of the gate. The layer 131 preferably has a thickness ranging from 10 to 100 nm, and preferably from 12 to 30 nm. As a matter of fact, it is advantageous that the thickness of the layer 131 is greater than the thickness of the sources and drains to ensure that no dopant is implanted into the channel during the implantation thereof.

It should be noted that the layer 131 generally forms a protective layer. It advantageously consists of an oxide layer, for example formed from the semiconductor material of the layer 132. However, the invention is not limited only to the oxide layers. For example, the layer 131 may be made of silicon nitride. In the following description, for clarity, this layer will be referred to as the oxide layer 131 without it being limiting.

The definition of the gate 120 is then made using a conventional photolithography operation. The gate patterns 125 are then etched into the oxide layer of 131 which has preferably been deposited. It may also be thermally grown from the surface silicon layer 132 of the SOI substrate. However, in this case, the initial thickness 139 will be changed. It should be noted here that this lithography operation is the opposite of what is usually done where the source and drain zones 110, on the contrary, are opened by photolithography.

Figure 3B:
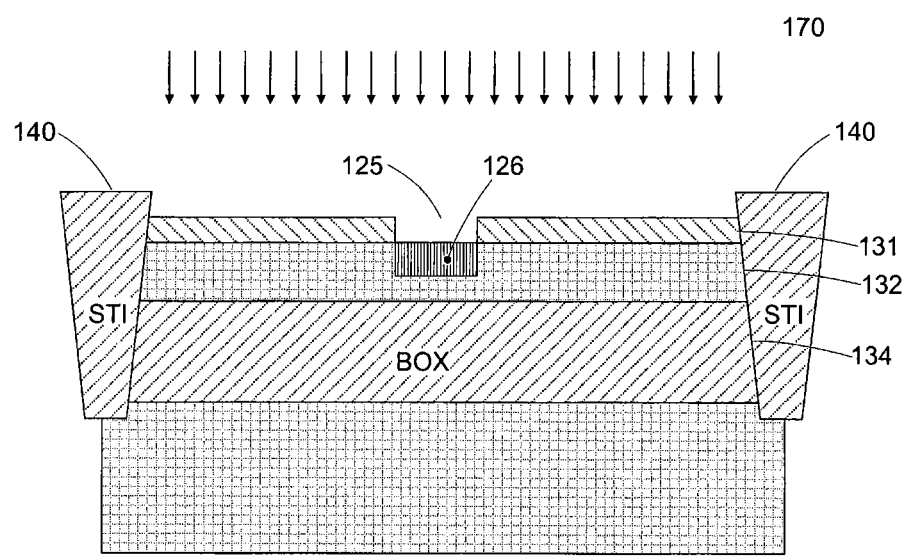

FIG. 3b illustrates the next step during which amorphization 126 of the silicon of the layer 132 is performed in the open zones 125 by ion implantation 170 on a controlled depth.

The step of amorphization is executed for example by implanting the argon species with an energy of 2 keV (kilo electron volts) and a dose of 1015 atoms per cm2 which results in the amorphization of the silicon layer to a depth of 6 nm. In another exemplary implementation, amorphization is executed to a depth of 8 nm with an energy of 4 keV and a lower dose of 514 atoms per cm2. More generally, the energy/dose couple is set, for a given species implanted, so as to amorphize the material of the layer 132 on a thickness corresponding to the thickness desired to be etched. The persons skilled in the art know how to determine by calculation or experiment the implantation conditions enabling the amorphization on the desired thickness. It should be noted that the unopened source/drain are protected from ion implantation so as to avoid any amorphization where the layer 131 is present.

Figure 3C:
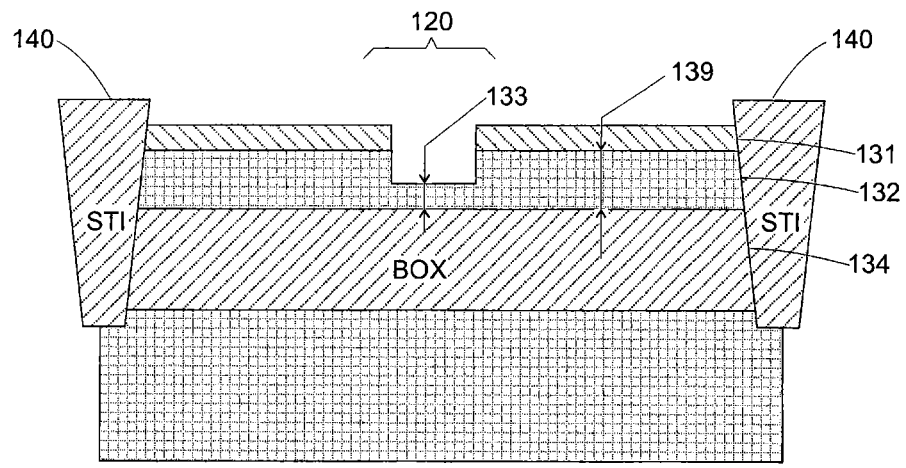

FIG. 3c shows the result of the highly anisotropic etching on the silicon zones made amorphous by the preceding operation. The etching is executed in the gaseous phase in presence of hydrogen chloride (HCl). It is carried out at a temperature of about 590° C. which makes it possible to etch the amorphous silicon and does not significantly etches the single-crystal silicon. As a matter of fact, under these conditions, the selectivity of the etching is of the order of 100 between the crystalline phase and the amorphous phase of silicon. The preceding step of amorphisation and the etching of the amorphous silicon leave in place a residual thickness 133 of the superficial layer 132 of the SOI substrate that defines the desired height for the conduction channel. This selectivity of the etching of the semiconductor material made amorphous relative to the same material which is still crystalline enables a good control of the depth of the etching and therefore a correct mastering of the channel thickness too. Thus, unlike the standard method, the layer 132 is thinned only where really necessary to adjust the electrical parameters of the transistor. The superficial layer 132 keeps its integral original thickness 139 outside these zones. The good uniformity of the original layer of the SOI substrate is not affected by successive etching as in the standard method.

Figure 3D:
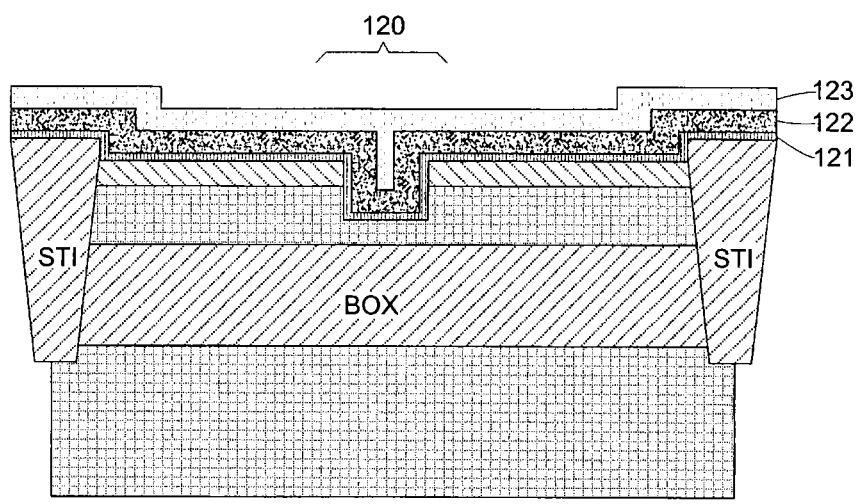

FIG. 3d illustrates the deposition of a plurality of layers forming the stack of the gate electrode layers on the entire wafer. The composition thereof is not different from the layers 121 (oxide) 122 (metal) and 123 (polycrystalline silicon) of the standard method which has already been described in FIG. 2. In the method according to the invention, high permittivity insulating material such as hafnium oxide (Hf02) having a dielectric constant close to 25, aluminum oxide, nitrided hafnium silicate (HfSiON), Zinc oxide (Zr02) or any other material preferably having a dielectric constant greater than 8 can advantageously be used for the dielectric layer 121. A spacer (not shown) may advantageously be made with another material prior to the deposition of the stack of gate layers mentioned above as described in the FIGS. 4a to 4c below. The material constituting the spacer may be silicon nitride or oxide, for example of said high temperature (HTO) type or tetraethoxysilane (TEOS) having a lower dielectric constant than the high-permittivity (high-k) material of the layer 121 so as to reduce the parasitic capacitances between the source and drain (SD) electrodes on the one hand and those of the gate on the other hand.

Figure 3E:
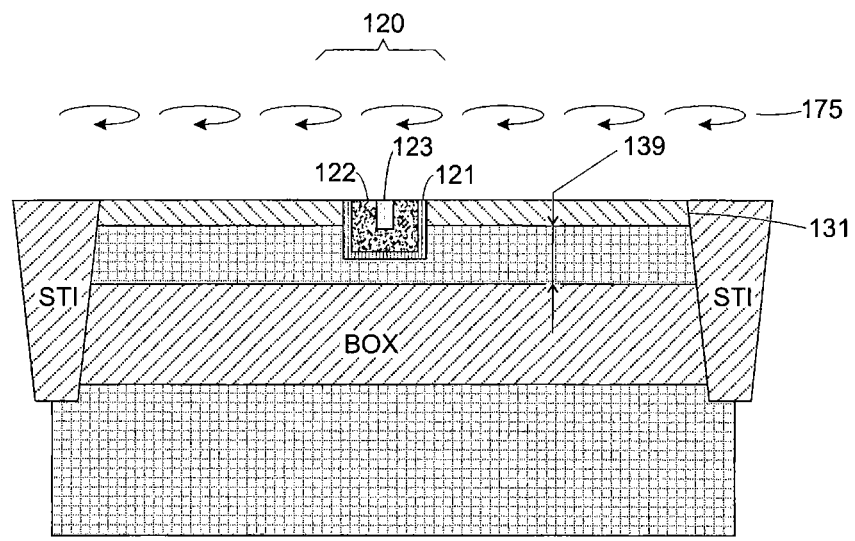

FIG. 3e illustrates the result of the step of chemical mechanical polishing 175 or CMP which is carried out afterwards to leave the above layers only in the previously etched patterns defining the gate 120. The polishing is stopped in the oxide layer 131 covering the superficial layer 132 of the SOI substrate. It should be noted again that the uniformity and the thickness 139 of the layer 134 are those of the starting SOI substrate and have not been altered in any way by the preceding steps of the method of the invention.

Figure 3F:
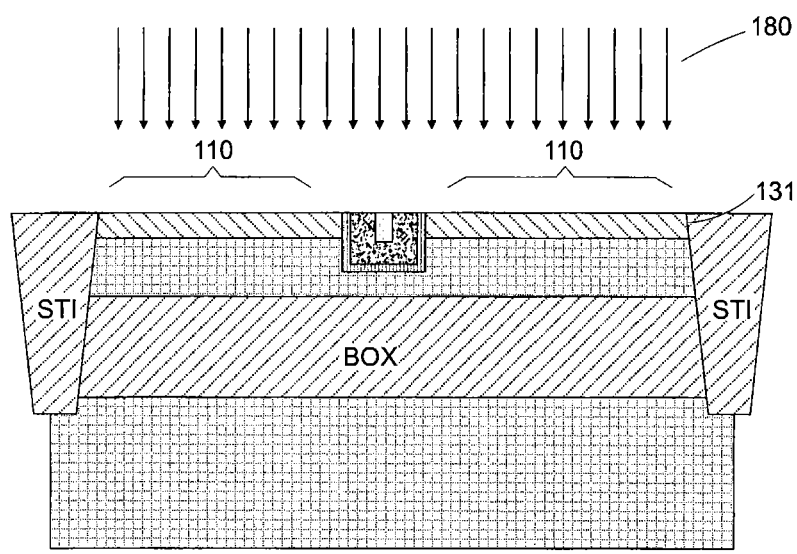

FIG. 3f illustrates the formation of the source and drain zones by ion implantation 180 of dopant species. These preferably are arsenic (As) or phosphorus (P) for a N-type doping, or boron (B) or boron difluoride (BF2) for a P-type doping. Such steps of implantation are then followed by thermal annealing. This may be for example a rapid thermal anneal or "TSR" or annealing carried out with a laser in order to crystallize and/or to activate the dopants. The annealing temperature may range from 900° C. to 1,300° C., and the annealing time may vary from a few milliseconds to one second.

The implementation 180 of the source and drain zones is preferably a full plate implantation, without any protection of the gate zones 120. The oxide layer 131 is then removed beforehand, for example by chemical etching. The thickness of the gate stack must be greater than the thickness whereon the source and drain zones are desired to be doped. The implantation of dopant species into the gate metal has no drawback.

In one alternative embodiment, implantation 180 is carried out only in the source and drain zones 110 without any implantation, in particular at the gate level.

Figure 3G:
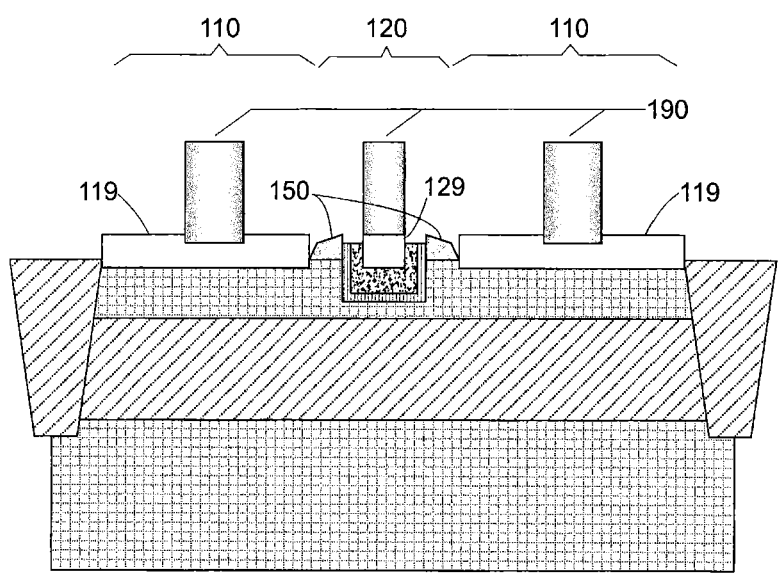

FIG. 3g shows the final structure of the transistors after removal of the oxide layer 131 and silicidation of the source and drain 119 and gate 129 electrodes. As indicated above the layer 131 is removed by etching. When it is made of silicon oxide, etching is performed using hydrofluoric acid (HF). In the case of silicon nitride, the etching can be with a HF/ethylene glycol mixture, or with hot ortho phosphoric acid. As already seen, this operation makes it possible to obtain a good electrical contact on the electrodes with the metal vias 190 that are created during the so-called "end of line" or BEOL standard operations, the acronym for "back-end of line" during which interconnections are performed between the active components.

Optionally, as shown in FIG. 3g, spacers 150 will thus have been made to reduce the capacitance between the source and drain contacts and the gate contact. To obtain such spacers, after removal of the layer 131, a conformal layer of silicon nitride for example may be deposited, and then anisotropically etched using plasma etching. The method for obtaining such spacers is well known to the persons skilled in the art.

FIGS. 4a to 4d illustrate an alternative embodiment of the method for the invention which makes it possible to reduce stray capacitances between the source and drain electrodes on the one hand and the gate electrode of the other hand. In this embodiment, the gate pattern is etched according to the crystallographic planes of the silicon of the superficial layer 132 of the SOI substrate.

Figure 4A:
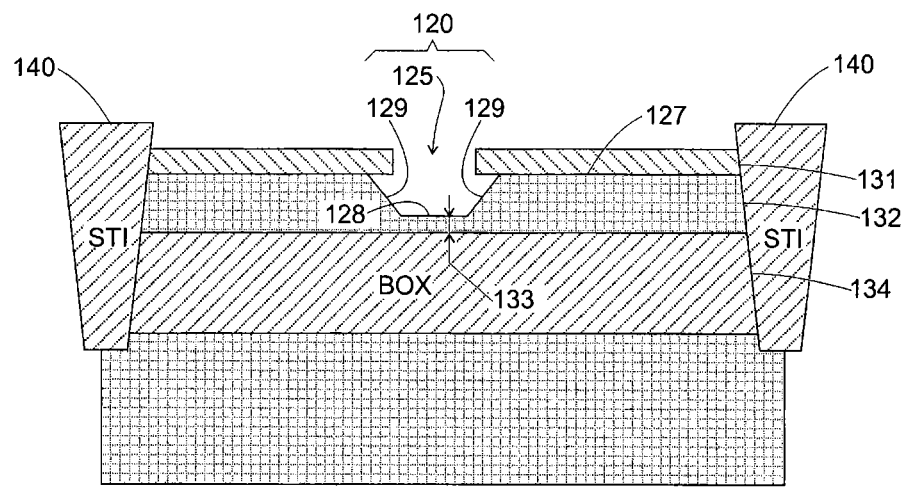
FIGS. 4a to 4d describe an alternative implementation of the invention intended to reduce the parasitic capacitances of the transistor.

The single-crystal silicon is etched at a higher temperature than the HCl etching of the amorphized silicon described above. It is typically etched at temperatures above 700° C. (against typically 590° C. for the etching of the amorphized silicon). The etching rate then depends on the crystallographic directions. For crystalline silicon oriented along the plane (100), an etched shape corresponding to FIG. 4a is obtained. This etching technique which complies with the crystallographic planes is known to the persons skilled in the art.

The step of FIG. 4a is substituted for the step described in FIG. 3c wherein the very selective etching of the amorphized silicon is carried out then. The gate pattern 120 is etched as in the latter figure, in the gaseous phase, in presence of hydrogen chloride (HCl). However, in this case, it is carried out according to the crystallographic planes with a low etching rate of the order of 0.1 nm per second, which enables a good control of the thickness etched in order to precisely obtain the desired thickness 133 of the channel. As the etching is carried out along the crystallographic planes, a flat etching of the bottom 128 of the cavity is obtained, with the silicon of the superficial layer 132 being oriented in this non restrictive example according to said atomic plane (100) as already mentioned above. The pattern etched into the superficial layer also has slanted walls 129 that join the flat bottom 128 and the upper face of the superficial layer 132. The advantage of obtaining a "tapered" shape inside the cavity consists in being able to "move away" the upper portions of the source and drain of the transistor from the transistor gate. This results in reducing the parasitic capacitance between the gate and the source on the one hand, and the gate and the drain of the other hand. Reducing the parasitic capacitance makes it possible to improve the dynamic properties of the transistor, and thus the velocity of the integrated circuits (for a given gate length).

Figure 4B:
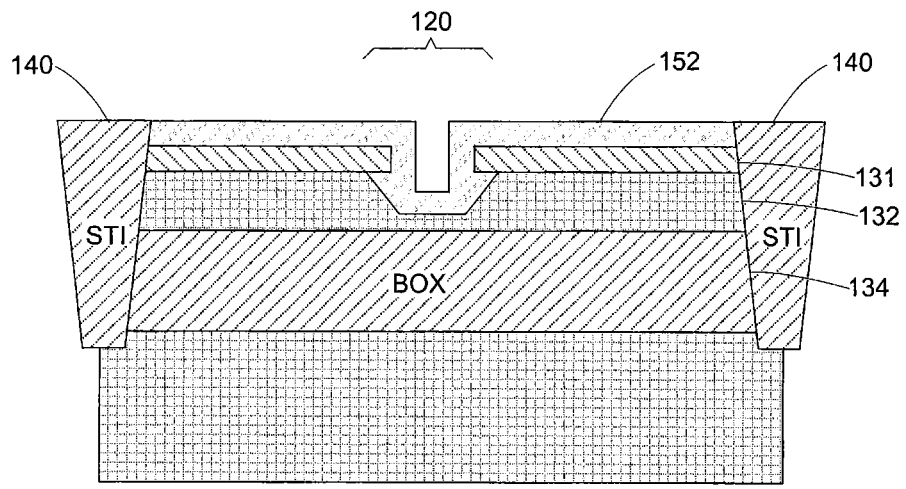

FIG. 4b illustrates the next step wherein a conformal deposition of a dielectric layer such as a layer of silicon nitride 152 is carried out. The deposition is performed for example using a PECVD technique, the acronym for "plasma-enhanced chemical vapor deposition", i.e. by "plasma-assisted chemical vapor deposition", or using the so-called "iRad" method, marketed by the Japanese TEL (Tokyo Electron) company.

Figure 4C:
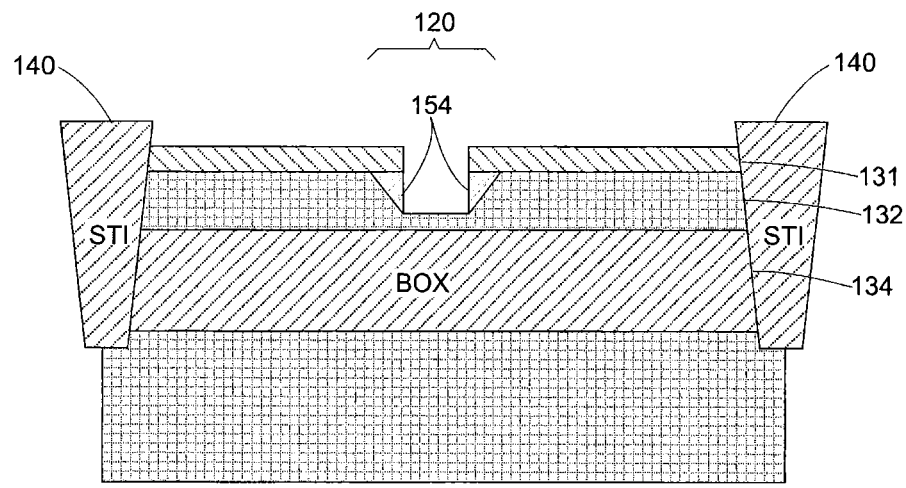

FIG. 4c shows the spacers 154 which make it possible to reduce the parasitic capacitances between SD on the one hand and the gate of the other hand. They are created after anisotropic plasma etching for example using a so-called RIE technique, the English acronym for "reactive ion etching", of the silicon nitride deposited at the preceding step.

Figure 4D:
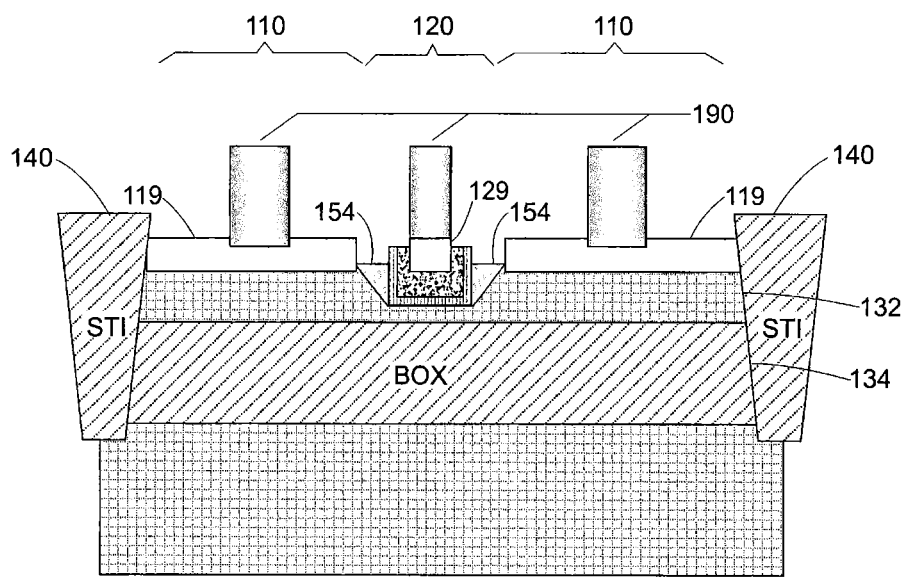

Upon completion of this step of etching the spacers 152, the gate is filled as described in the previous embodiment, from FIG. 3c, to obtain the result shown in FIG. 4d.

Whatever the modes of implementation of the invention described above, it should be noted here that it may be advantageous for the production of P-channel transistors (PFET) to produce the latter, not as described, using silicon, but using an alloy of silicon and germanium Si(1−x)Ge(x), where x is the fraction of germanium in the alloy. The method of the invention makes it possible to obtain a channel made of SiGe using techniques known to the persons skilled in the art which includes the deposition of germanium followed by a thermal annealing, the deposition of germanium followed by an oxidation, or the ion implantation of germanium and a recrystallization annealing. SiGe is then immediately deposited after the opening of the cavity 125. The upper part of the source and drain is then protected by the layer 131.

Figure 5:
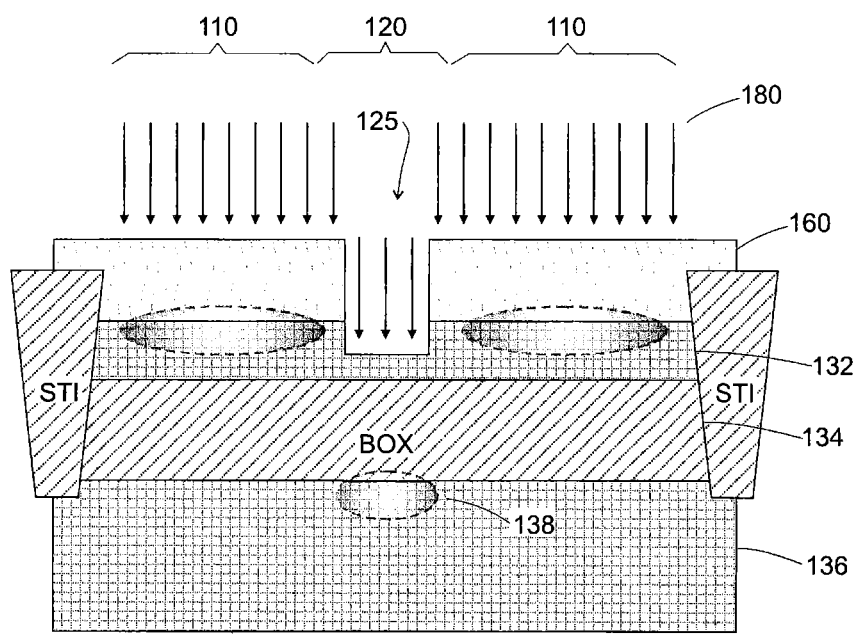
FIG. 5 illustrates a variant of the method wherein the doping of the source and drain zones of the transistor and that of a ground plane located beneath the buried oxide layer of the substrate in the gate zone are carried out simultaneously.

Eventually, as shown in FIG. 5, it should also be noted that the method of the invention advantageously enables the simultaneous formation by ion implantation 180 of the source and drain zones 110 and of a "ground plane" 138, as disclosed in FIG. 2c, which is limited in this case to the gate zone 120. To achieve this result, a thick padoxide 160 (used for forming the STI zones) is preferably used. When the etching of the gate cavity 125 is completed a shallow "ground plane" is implanted under the bottom of the gate cavity 125 and the source and drain zones are simultaneously doped. The gate is then formed in the cavity 125.

In view of the foregoing description, it is clear that the methods according to the invention provide solutions to the non-uniformity and variability of the silicon layer from which the transistors are produced. These methods thus make it possible to reduce the thickness dispersion which affects the channel and the RSDs in the technologies of the FDSOI types used for current technological nodes. The methods of the invention particularly advantageously provide an improvement both locally in each transistor, and globally at the wafer level.

The invention is not limited to the embodiments described above but applies to all the embodiments covered by the scope of the claims.

The invention claimed is:

1. A method for producing a field effect transistor from a stack of layers forming a substrate of a semiconductor-on-insulator, with the stack of layers including a superficial layer of semiconductor material having an initial thickness, made of a crystalline semiconductor material and covered with a protective layer, the method comprising:

defining, using photolithography, a gate pattern in the protective layer, the gate pattern comprising an opening formed in the protective layer to expose an upper surface of the superficial layer of semiconductor material and define an opening zone of the superficial layer of semiconductor material;

etching the gate pattern into the superficial layer by removing a portion of the superficial layer in the opening zone of the superficial layer to a controlled depth to leave a remaining portion of the superficial layer of semiconductor material in place in the opening zone of the superficial layer, with the remaining portion of the superficial layer defining a height of a conduction channel of the field effect transistor;

forming a gate in the gate pattern, comprising, after forming the gate pattern:

depositing a plurality of layers configured to form the gate over a remainder of the protective layer and over the remaining portion of the superficial layer within the opening zone of the superficial layer, one of the plurality of layers comprising a gate metal, and a chemical mechanical polishing of each of the plurality of layers to expose the remainder of the protective layer and to leave the plurality of layers in the gate pattern only within the opening zone of the superficial layer and within a remainder of the opening formed in the protective layer after the chemical mechanical polishing; and forming source and drain zones in the superficial layer and on either side of the gate while preserving, in the source and drain zones, the initial thickness of the superficial layer, said source and drain zones being formed by ion implantation into the superficial layer having an upper surface on which only the remainder of the protective layer and the gate are disposed, using the gate as a mask to prevent said ion implantation in the conduction channel.

2. The method according to claim 1, wherein the etching of the gate pattern is preceded by an amorphization of the semiconductor material of the superficial layer at the controlled depth of the superficial layer to form an amorphized zone in the opening zone of the superficial layer.

3. The method according to claim 2, wherein the gate pattern is selectively etched in the amorphized zone.

4. The method according to claim 2, wherein the amorphization comprises implanting species selected from the group of argon and germanium.

5. The method according to claim 2, wherein the amorphization comprises a highly anisotropic ion bombardment, with a direction of the bombardment being substantially perpendicular to a surface of the superficial layer.

6. The method according to claim 2, wherein the etching is conducted in gaseous phase in presence of hydrogen chloride (HCl).

7. The method according to claim 1, wherein the etching of the gate pattern is carried out according to crystallographic planes of the semiconductor material constituting the superficial layer to leave a flat-bottomed cavity partly extending under a lower face of the protective layer and on either side of the gate pattern.

8. The method according to claim 7, wherein the deposition of the plurality of layers configured to form the gate is preceded by the compliant deposition of a layer of a low-permittivity material, having a K dielectric constant lower than 10.

9. The method according to claim 8, further comprising at least one etching of the layer of the low-permittivity material to leave in place spacers on either side of the gate pattern only.

10. The method according to claim 9, wherein the low-permittivity material is selected from: silicon nitride, silicon oxide, high-temperature (HTO) silicon oxide, or tetraethoxysilane (TEOS).

11. The method according to claim 1, wherein the deposition of the plurality of layers comprises depositing a layer of oxide; with the layer of oxide comprising a high-permittivity insulating material having a dielectric constant greater than 8.

12. The method according to claim 1, wherein the superficial layer has the initial thickness ranging from 6 to 30 nm.

13. The method according to claim 1, wherein the etching of the gate pattern is performed to leave in place a thickness defining the conduction channel of the field effect transistor between 1 and 10 nm.

14. The method according to claim 1, further comprising forming trenches configured to electrically insulate the field effect transistor in a casing.

15. The method according to claim 1, further comprising, between the etching the gate pattern into the superficial layer and prior to the forming the gate: ion implantation carried out at least at right angles to the gate pattern and implanting a substrate underlying an insulating layer of the stack forming the substrate of the semiconductor-on-insulator type to achieve a ground plane.

16. The method according to claim 1, wherein the superficial layer has the initial thickness ranging from 8 to 20 nm.

17. The method according to claim 1, wherein the superficial layer has the initial thickness of about 12 nm.

18. The method according to claim 1, wherein the etching of the gate pattern is performed to leave in place a thickness defining the conduction channel of the field effect transistor between 2 and 8 nm.

19. The method according to claim 1, wherein the etching of the gate pattern is performed to leave in place a thickness defining the conduction channel of the field effect transistor of about 6 nm.

20. The method according to claim 2, wherein the amorphization comprises anisotropically implanting ions directly into the superficial layer through the opening of the protective layer.

21. The method according to claim 20, wherein etching the gate pattern into the superficial layer comprises using only the protective layer having the opening as a mask.

\* \* \* \* \*